(12) United States Patent
Tanaka

(10) Patent No.: US 8,789,002 B2
(45) Date of Patent: Jul. 22, 2014

(54) METHOD FOR MANUFACTURING SEMICONDUCTOR DEVICE ON THE BASIS OF CHANGED DESIGN LAYOUT DATA

(75) Inventor: Takuji Tanaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1030 days.

(21) Appl. No.: 12/339,652

(22) Filed: Dec. 19, 2008

(65) Prior Publication Data

US 2009/0172611 A1 Jul. 2, 2009

(30) Foreign Application Priority Data

Dec. 26, 2007 (JP) .................................. 2007-334030

(51) Int. Cl.
*G06F 17/50* (2006.01)

(52) U.S. Cl.
USPC ............ 716/132; 716/119; 716/136; 716/137

(58) Field of Classification Search
None
See application file for complete search history.

(56) References Cited

U.S. PATENT DOCUMENTS

| 6,009,248 | A * | 12/1999 | Sato et al. ...................... 716/114 |
| 6,330,526 | B1 * | 12/2001 | Yasuda .............................. 703/2 |
| 6,675,139 | B1 * | 1/2004 | Jetton et al. ...................... 703/17 |
| 7,016,794 | B2 * | 3/2006 | Schultz ............................ 702/64 |
| 7,536,667 | B2 * | 5/2009 | Hiroi ............................... 716/50 |
| 7,673,260 | B2 * | 3/2010 | Chen et al. ...................... 716/106 |
| 7,923,266 | B2 * | 4/2011 | Thijs et al. ...................... 438/14 |
| 8,024,674 | B2 * | 9/2011 | Arimoto .......................... 716/51 |
| 2004/0044511 | A1 * | 3/2004 | Sekido et al. ..................... 703/14 |
| 2006/0142987 | A1 * | 6/2006 | Ishizu et al. ..................... 703/14 |
| 2006/0282249 | A1 | 12/2006 | Ikoma et al. |
| 2009/0089037 | A1 * | 4/2009 | Yamada .......................... 703/14 |
| 2010/0030545 | A1 * | 2/2010 | Uno et al. ....................... 703/13 |
| 2011/0237005 | A1 * | 9/2011 | Kim et al. ....................... 438/16 |

FOREIGN PATENT DOCUMENTS

| JP | 08-123850 A | 5/1996 |
| JP | 9-64187 A | 3/1997 |
| JP | 11-133586 A | 5/1999 |
| JP | 2004-31909 A | 1/2004 |
| JP | 2006-343217 A | 12/2006 |

OTHER PUBLICATIONS

Japanese Office Action dated Feb. 7, 2012, issued in corresponding Japanese Patent Application No. 2007-334030.

* cited by examiner

*Primary Examiner* — A. M. Thompson
(74) *Attorney, Agent, or Firm* — Westerman, Hattori, Daniels & Adrian, LLP

(57) ABSTRACT

A method of manufacturing a semiconductor device on the basis of changed design layout data. The method decides a functional relationship between layout parameters based on layout data and the electrical characteristic of a plurality of semiconductor elements. Candidates of the values of the layout parameters are extracted from design layout data so as to decrease the difference between a target electrical characteristic and a predicted electrical characteristic. A specific value from the candidate values of the layout parameters is selected and the design layout data is changed based on the specific selected value.

8 Claims, 19 Drawing Sheets an example of layout information layout information variation of characteristic based on rounding Influence of the source/ drain an example of a layout data and a layout parameters of a standard transistor.

layout depending TEG(test element group)

METHOD FOR MANUFACTURING SEMICONDUCTOR DEVICE ON THE BASIS OF CHANGED DESIGN LAYOUT DATA

CROSS-REFERENCE TO RELATED APPLICATIONS

This application is based upon and claims the benefit of priority from the prior Japanese Patent Application No. 2007-334030, filed on Dec. 26, 2007, the entire content of which is incorporated herein by reference.

BACKGROUND OF THE INVENTION

1. Field of the Invention

The present invention relates to a method for manufacturing a semiconductor device.

2. Description of the Related Art

In a semiconductor integrated circuit, a peripheral layout of elements such as transistors formed in the integrated circuit has an influence on characteristics of the devices. Characteristics of a manufactured semiconductor integrated circuit are predicted by performing a simulation on the basis of layout data in a designing stage.

Even if the layout data is corrected on the basis of the above-described simulation, it may be impossible to obtain desired characteristics depending on a manufacturing line.

SUMMARY

According to an aspect of the invention, a method of manufacturing a semiconductor device has measuring an electrical characteristic of a plurality of semiconductor elements, defining layout parameters on the basis of layout data of the plurality of semiconductor elements and deciding a functional relationship between the layout parameters and the electrical characteristic, extracting values of the layout parameters from design layout data of the semiconductor device, calculating a predicted electrical characteristic of the semiconductor device on the basis of the values of the layout parameters and the functional relationship, calculating a difference between a target electrical characteristic and the predicted electrical characteristic of the semiconductor device, generating a plurality of candidates of the values of the layout parameters, selecting a specific value from among the candidates so as to decrease the difference between the target electrical characteristic and the predicted electrical characteristic, changing the design layout data on the basis of the specific value, and manufacturing the semiconductor device on the basis of the changed design layout data.

PREFERRED EMBODIMENT

The configuration according to an embodiment described below is an example and the present invention is not limited to the configuration of the embodiment.

Figure 1:
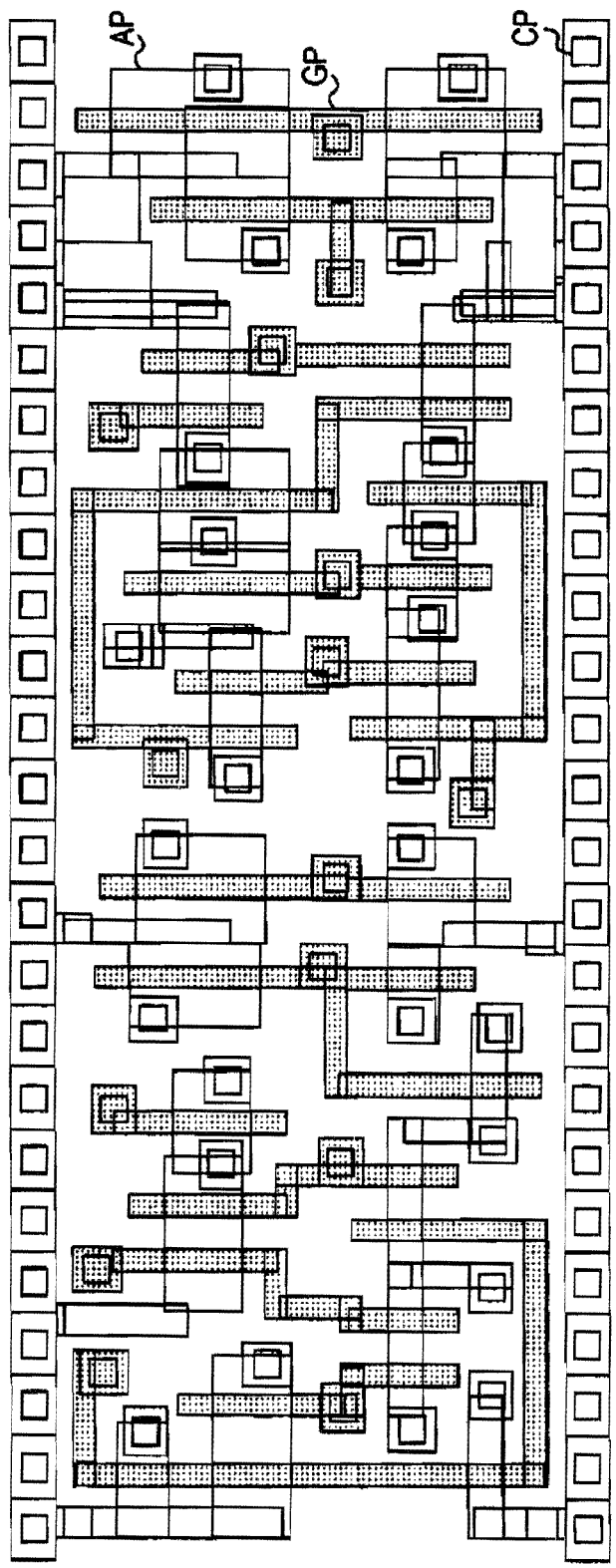
FIG. 1 illustrates an example of a layout of a semiconductor integrated circuit.

FIG. 1 illustrates an example of a plan view of a layout of a semiconductor integrated circuit. It consists of three layers: active, gate pattern and conductive plugs. GA represents a gate pattern, AP represents an active pattern, and CP represents a conductive plug. A plurality of transistors, each including a source, a drain, a gate and a well are formed in the layout data. In the layout data illustrated in FIG. 1, the respective transistors have different shapes, and patterns of various shapes are formed. For example, the transistors have a narrow gate width or a wide gate width, a narrow source/drain width or a wide source/drain width, a rectangular active region or a complicated-shaped active region, and a small or large gap between plugs.

Figure 2A:
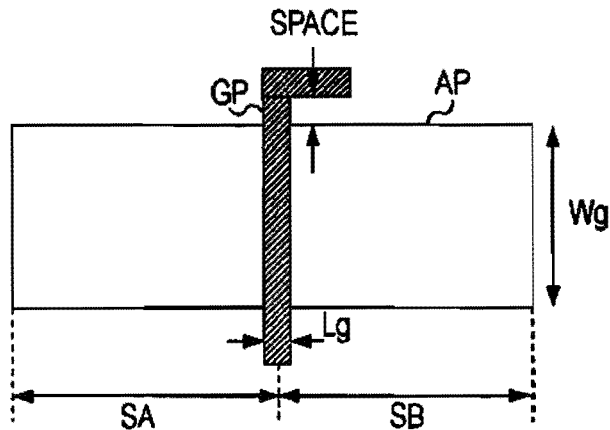
FIG. 2A illustrates an example of layout data of a transistor.

FIG. 2A illustrates an example of a plan view of layout data of a transistor. In the transistor illustrated in FIG. 2A, the gate is L-shaped. Lg represents a gate length and Wg represents a gate width. SA and SB represent widths of source and drain regions, respectively. A space is formed between the L-shaped gate and a source/drain portion.

Figure 2B:
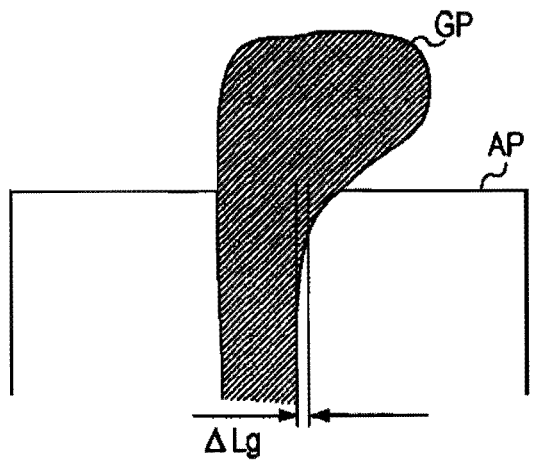
FIG. 2B illustrates an example of a pattern formed over a semiconductor substrate.

FIG. 2B illustrates a plan view of pattern that is actually formed over a semiconductor substrate on the basis of the layout data illustrated in FIG. 2A.

Figure 3A:
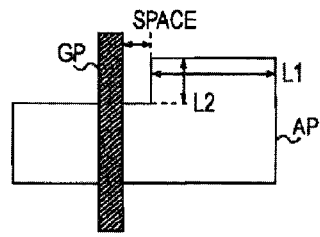
FIG. 3A illustrates an example of an active layer where a source/drain is formed.
Figure 3B:
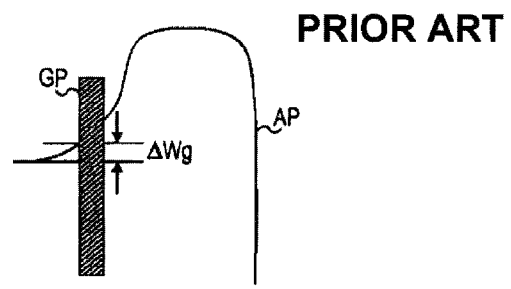
FIG. 3B illustrates an example of a pattern formed over a semiconductor substrate.

The transistor illustrated in FIG. 3A has an L-shaped active layer in which a source/drain is formed. FIG. 3B illustrates a plan view of a pattern that is actually formed over a semiconductor substrate on the basis of the layout data illustrated in FIG. 3A.

Figure 4:
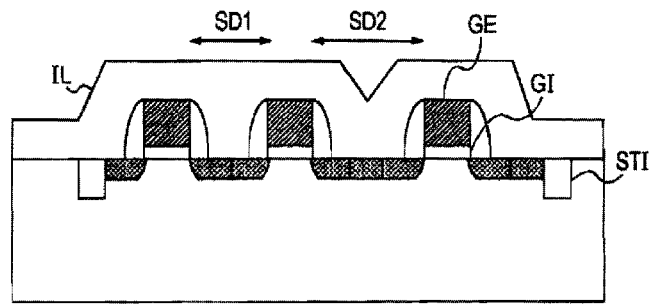
FIG. 4 is a cross-sectional view of a semiconductor substrate and a pattern formed over the semiconductor substrate.

FIG. 4 is a cross-sectional view of a semiconductor substrate and a pattern formed thereon. GI represents a gate electrode, GI represents a gate insulating film, and STI represents an isolation region. SD1 is narrower than SD2.

The concentration of impurity injected to the SD1 part is lower than in the SD2 part. The stress applied from an interlayer film formed over the transistor has different influences on the SD1 part and the SD2 part. IL represents an interlayer film. The stress has an influence on the source/drain and channel, and also on a transistor characteristic. Furthermore, a silicide layer formed over a gate electrode, a source/drain shape, and parasitic resistances are different between the SD1 part and the SD2 part. Also, an I-V characteristic in the horizontal direction of FIG. 4 is not expressed by a simple series.

It is important to evaluate an influence of difference in layout on a circuit characteristic.

This manufacturing method provides a technique of manufacturing semiconductor devices having target electrical characteristics even in different manufacturing processes or different manufacturing lines by correcting layout data when the layout data and the target electrical characteristics of the semiconductor devices are given. Values of configurations and dimensions of semiconductor elements are extracted from the layout data. Also, variables to which the extracted values are substituted are defined. The variables are called "layout parameters".

In this manufacturing method, it is preferable to use a plurality of layout parameters so that control is performed in view of a plurality of factors given by the layout data to the manufacturing process.

First, electrical characteristics of a semiconductor device are obtained as a function with a plurality of layout parameters as independent variables. Alternatively, a function indicating the relationship between change in parameters and change in characteristics is obtained. Such a function is also called sensitivity. Candidate layout parameters are obtained by using an inverse function of the multivariable function which is derived from the previous step. Then, an appropriate parameter set is selected from among the candidates. The above-described process realizes a method for correcting layout data and a method for correcting a mask to transfer a semiconductor circuit that enables or simplifies manufacturing while recognizing complicated layout dependency.

Even in the case where a pattern dimension or a pattern gap in a layout is corrected, the corrected layout needs to be actually manufacturable. For this purpose, corrected layout data needs to satisfy a mask design rule. Alternatively, corrected layout data needs to satisfy a design layout preferred rule, which is a recommended value in manufacturing.

FIGS. 5 to 8 illustrate a procedure of collecting data indicating an influence of change in layout data on electrical characteristics of a semiconductor device to be manufactured.

Figure 5:
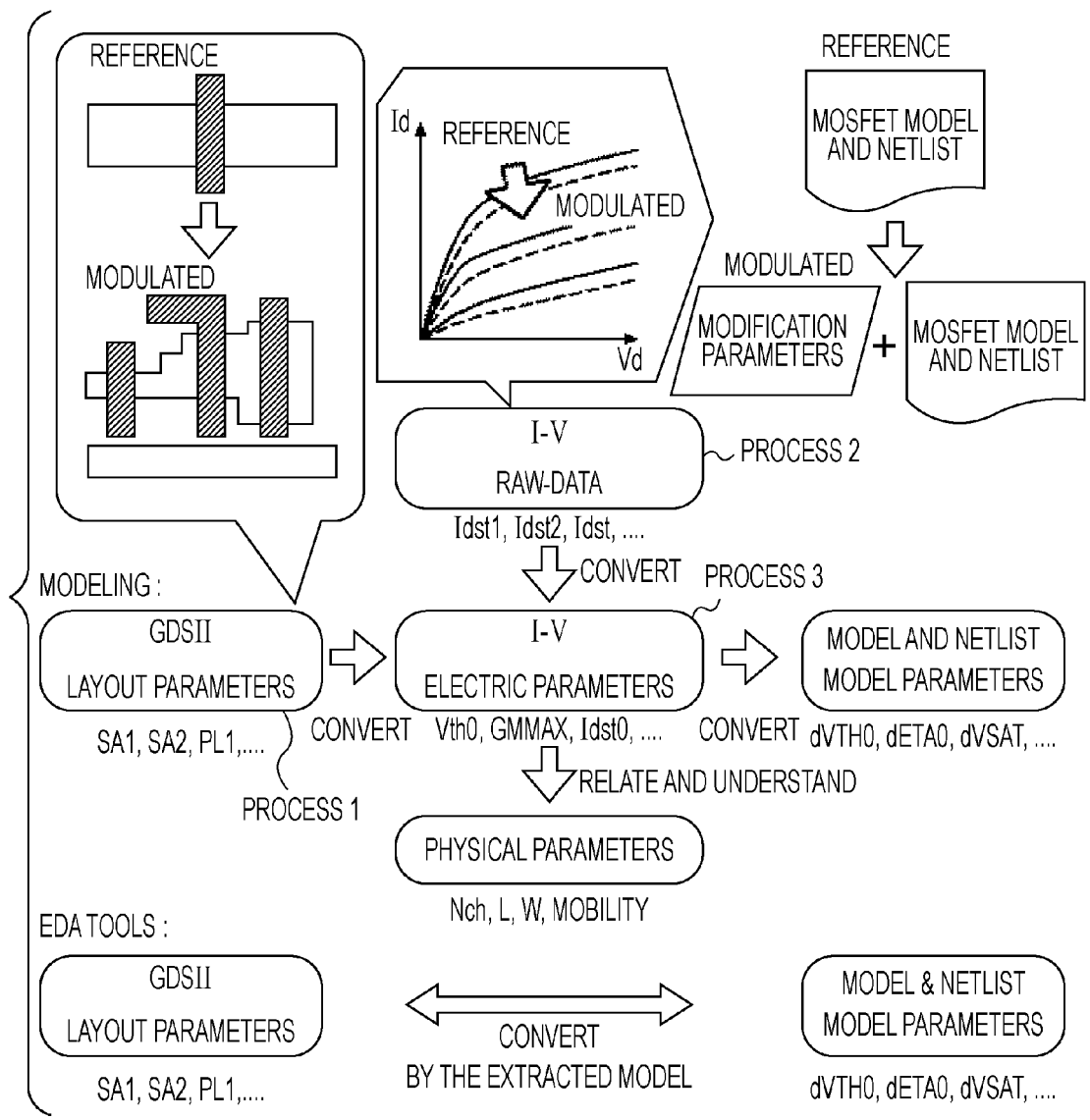
FIG. 5 illustrates a procedure of correcting data indicating the relationship between the layout data and electrical characteristics of a semiconductor device.

FIG. 5 is a flowchart illustrating a procedure of collecting data indicating the relationship between change in layout data and change in electrical characteristics of a semiconductor device. Hereinafter, a description is given about a procedure of collecting electrical characteristics in the case where a design pattern is changed with respect to a transistor including a typically-used rectangular source/drain and a simple linear gate.

Referring to FIG. 5, the layout of a standard transistor is indicated by "reference". On the other hand, layout data obtained by changing the layout of the standard transistor is indicated by "modulated".

Figure 7A:
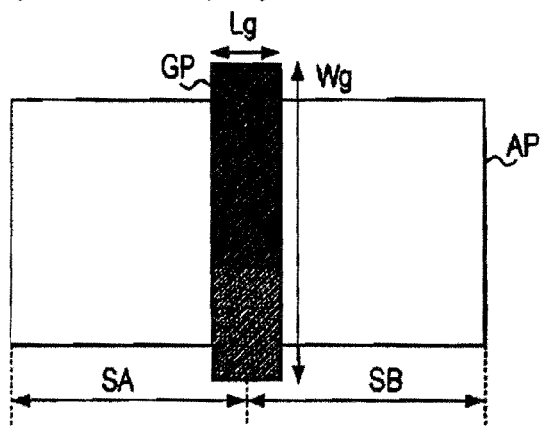
FIG. 7A illustrates an example of layout parameters of a standard transistor.

FIG. 7A illustrates an example of layout parameters extracted from the standard transistor. In this case, the layout parameters include source/drain widths SA and SB, a gate length Lg, and a gate width Wg.

Figure 7B:
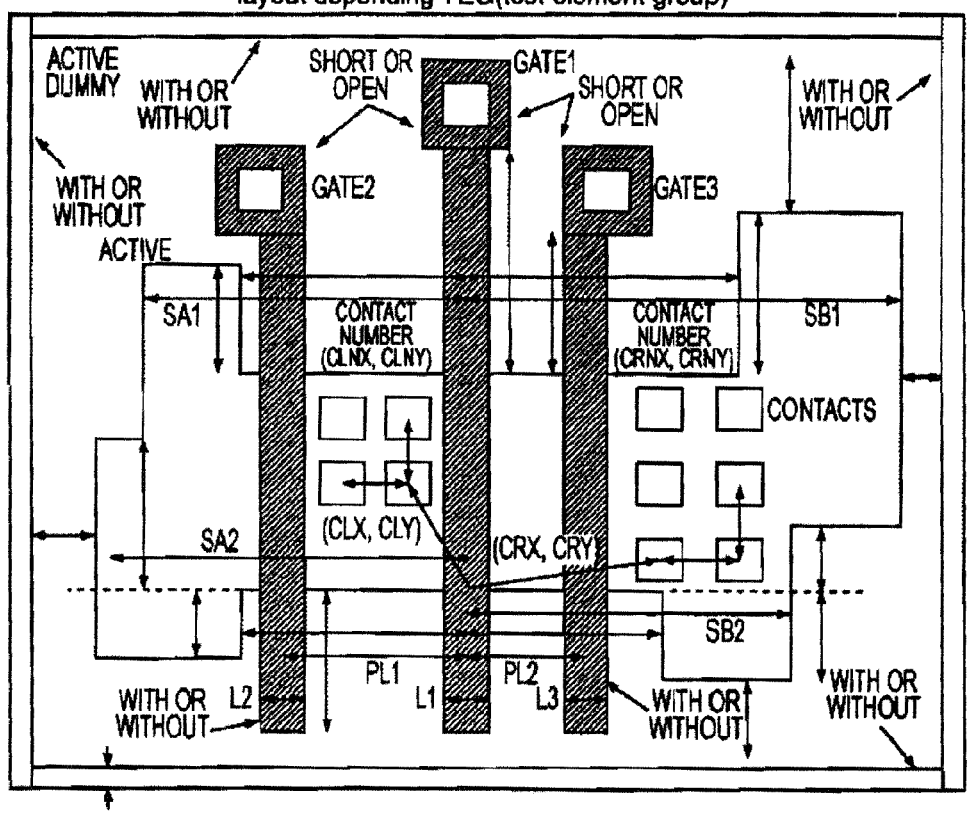
FIG. 7B illustrates an example of layout data with a changed design pattern and layout parameters obtained from the layout data.

FIG. 7B illustrates an example of layout data of a changed design pattern and layout parameters extracted from the layout data. Compared to the standard transistor, the source/drain region is complicated. As the parameters to define the width of an active region where a source/drain is formed, dimensions indicated by arrows SA1, SA2, SB1, SB2, and so on are used instead of SA and SB indicating the widths of simple rectangles. Also, the gate lengths are defined by a plurality of dimensions such as L1, L2, and L3. Pitches PL1 and PL2 between adjacent gates are defined. The layout parameters may also include gate widths of a plurality of gates adjacent to each other, for example Lw1, Lw2, and Lw3, distances between a plurality of active regions adjacent to each other, respective widths of the plurality of active regions adjacent to each other, the number of sources/drains and contact plugs, distances between the sources/drains and contact plugs and the gates, and distances between a border of different types of interlayer films and the gates.

FIG. 7A corresponds to the case where SA1=SA2=SA, SB1=SB2=SB, L1=Lg, L2=L3=0, and PL1=PL2=infinity in FIG. 7B.

Figure 8:
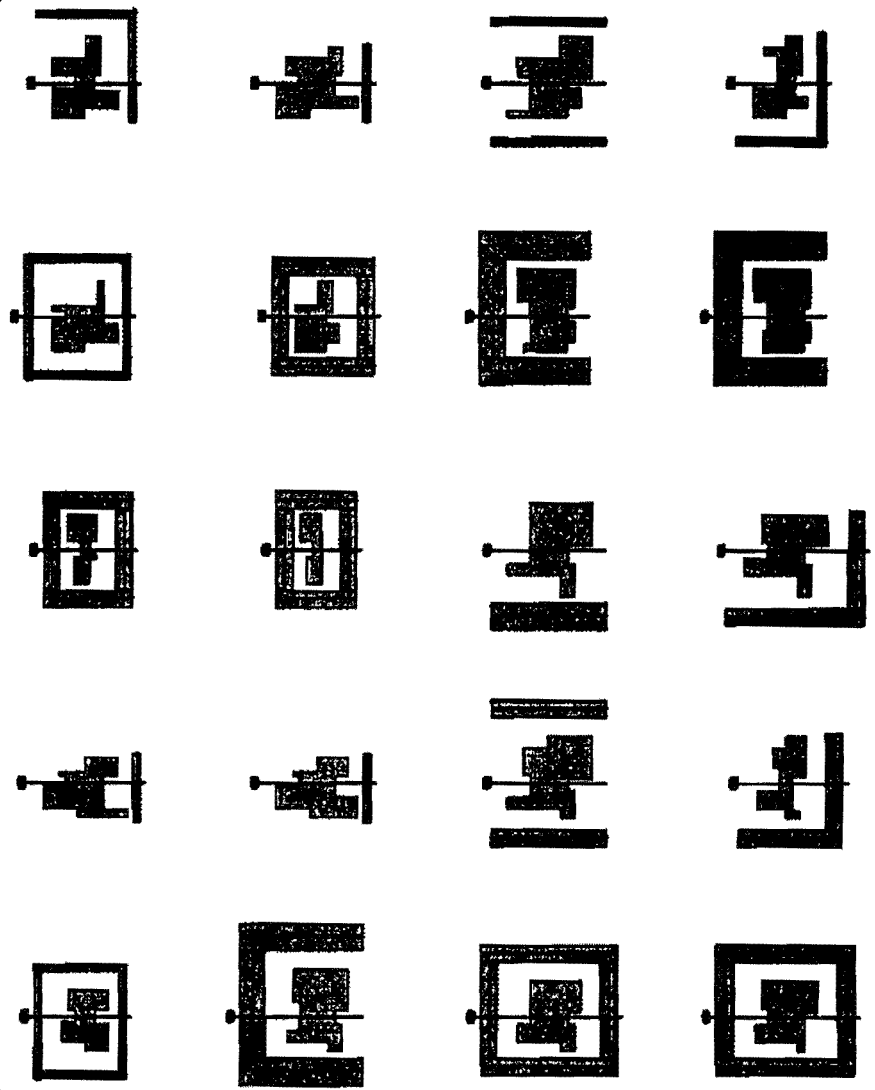
FIG. 8 illustrates an example of a plurality of layouts.

FIG. 8 illustrates an example of many layouts. Specifically, FIG. 8 illustrates an example of data of two layers of a photo mask forming a pattern of a semiconductor circuit, that is, a gate layer and an active layer. In FIG. 8, a black vertical line at the center of each pattern is the pattern of the gate. The other part corresponds to the pattern of the active region. In this embodiment, characteristic parts of the pattern, for example, the dimension of a portion protruded from a simple rectangle, the dimension of a gap between figures, and so on are extracted as layout parameters. The part to be extracted as a parameter is specified by displaying the layout data on a graphical user interface and accepting instructions from a user input through a pointing device, such as a mouse. The name of layout parameter may be automatically generated as a specific character string "SA" and a serial number, such as SA1 or SA2. The user may be allowed to input the name of parameter. Alternatively, a procedure of extracting shape parameters may be loaded to computer software so that the name of each parameter may be automatically generated through calculation by a computer.

The name of each side and the name of the gap between the sides may be given to the layout data. Furthermore, the pattern of the layout data may be displayed on the graphical user interface together with the names of those sides and gaps and selection and specification from the user may be accepted.

A description is given on the basis of the flow illustrated in FIG. 5. In this embodiment, a program is executed by a computer, so that a design and manufacture assisting system is constructed (hereinafter referred to as an information system).

Values of layout parameters are extracted from the layout data illustrated in FIG. 7B on the basis of the dimensions, gaps, and distances of corresponding parts (process 1). Parameter names such as SA1, SA2, and PL1 are set to the respective parts of the layout data through the graphical user interface, like the layout parameters illustrated in FIG. 7B. The dimensions, gaps, distances, and so on of those parts are extracted as the values of layout parameters. Such parameter names may be unique names in the information system.

A semiconductor element, such as a transistor, is manufactured on the basis of the layout data, and current/voltage characteristics (G1) are measured (process 2). In FIG. 5, the current/voltage characteristics corresponding to standard layout data as a reference layout data and modulated layout data are displayed. The information system extracts electrical characteristics, such as on-current Ids, threshold voltage Vth, drain current values Idst1 and Idst2 at predetermined gate voltage and drain voltage, and mutual conductance, from the current/voltage characteristics (process 3). Other than that, off-leak current that flows between source and drain when the transistor is in a shut-off state, delay time when a signal propagates in a logic circuit, and the life of an element or a semiconductor device may be regarded as electrical characteristics.

The information system extracts electrical characteristics from the current/voltage characteristics.

For example, the information system calculates an intersection Vth between a tangent having the largest inclination of the current/voltage characteristics and the axis of voltage indicated by Vd in graph G1 in FIG. 5. Drain current values at specific gate voltages and drain voltages are extracted as values of electrical characteristics, such as Idst1 and Idst2. When both the drain voltage and gate voltage are power supply voltages, the extracted current value is regarded as an on-current Ids.

Such a condition of extracting electrical characteristics is an example of a process. The conditions to be regarded as electrical characteristics can be set through the graphical user interface of the information system. For example, for the characteristic requiring evaluation or calculation from measurement data among the electrical characteristics, evaluation formulas and programs to calculate the evaluation formulas may be incorporated in the information system so that the user can specify execution of evaluation on a menu. As for electrical characteristics which are actual measurement values or empirical values, such as an off-leak current, delay time of a logic circuit, and a life of an element, whether the electrical characteristic should be used to correct the layout data may be selected by the user.

For example, in the case where the relationship between a measurement value of an off-leak current and layout parameters has been measured, the off-leak current may be described in a polynomial expression of the layout parameters. The layout data may be corrected so that the off-leak current has a target value.

This information system describes the relationship between the layout parameters extracted from the layout data and the electrical characteristics extracted from the current/voltage characteristics in a functional relationship. For example, characteristics such as the threshold Vth and the on-current Ids are represented by F1 and F2.

$$F1=F1(SA1,SA2,PL1,\dots) \quad \text{(Expression 1)}$$

The relational expression may be obtained through polynomial approximation based on empirical multiple regression analysis obtained on the basis of multivariate analysis, for example. The multiple regression analysis is an analysis method of fitting a value of a polynomial expression, a so called objective variable, to a characteristic value to be calculated by deciding a coefficient of a term of an independent variable, which is a plurality of variation amounts. Typically, the term of a polynomial expression is first-order or more, and a product of a plurality of variables may be included. In an ordinary case, a coefficient is decided so that the error between an objective characteristic value and a value of a polynomial expression is minimized in a definition region of a predetermined independent variable. Predicting an objective variable by using an independent variable is called simple regression analysis and an expression to predict the objective variable can be obtained by a least-squares method. As is known, in the least-squares method, a coefficient of an expression is decided to minimize the square sum of the error between an objective variable and an actual measurement value. The multiple regression analysis is an expansion of a variable to a plurality of variables.

Expression 2 is an example of a description of the electrical characteristic F1 with a polynomial expression of layout parameters.

$$F1 = a0 \cdot SA1 + a1 \cdot (SA1)^2 + \dots + b0 \cdot SA2 + b1 \cdot (SA2)^2 + \dots + c0 \cdot SA1 \cdot SA2 + d0 \cdot (SA1)^2 \cdot SA2 + \dots \quad \text{(Expression 2)}$$

Instead of the above-described relationship between the layout parameters and the electrical characteristics, the relationship between a change in layout parameters and a change in electrical characteristics may be obtained.

$$\Delta F1=F1(\Delta SA1,\Delta SA2,\Delta PL1,\dots) \quad \text{(Expression 3)}$$

For example, ΔSA1 and ΔSA2 are differential values of a portion protruded from a standard rectangle. ΔPL1 is a differential value with respect to a standard gate pitch in a specific technology. ΔF1 is the amount of change in transistor threshold Vth, on-current Ids, and so on.

By holding such a relational expression, the information system can provide the user with information to predict electrical characteristics of a semiconductor device from layout data.

On the basis of the relationship with the electrical characteristics extracted from the current/voltage characteristics, parameters VTH0 and ETA0 of a circuit simulation such as a SPICE simulation or the variation amounts dVTH0 and dETA0 thereof may be generated. The relationship between the extracted electrical characteristics and physical characteristics of semiconductor, e.g., the concentration of channel impurity Nch, physical dimensions of the gate L and W, and mobility, may be obtained. Mutual conversion between the layout parameters SA1, SA2, and PL1 and parameters of a circuit simulation such as the SPICE simulation may be performed.

Figure 6:
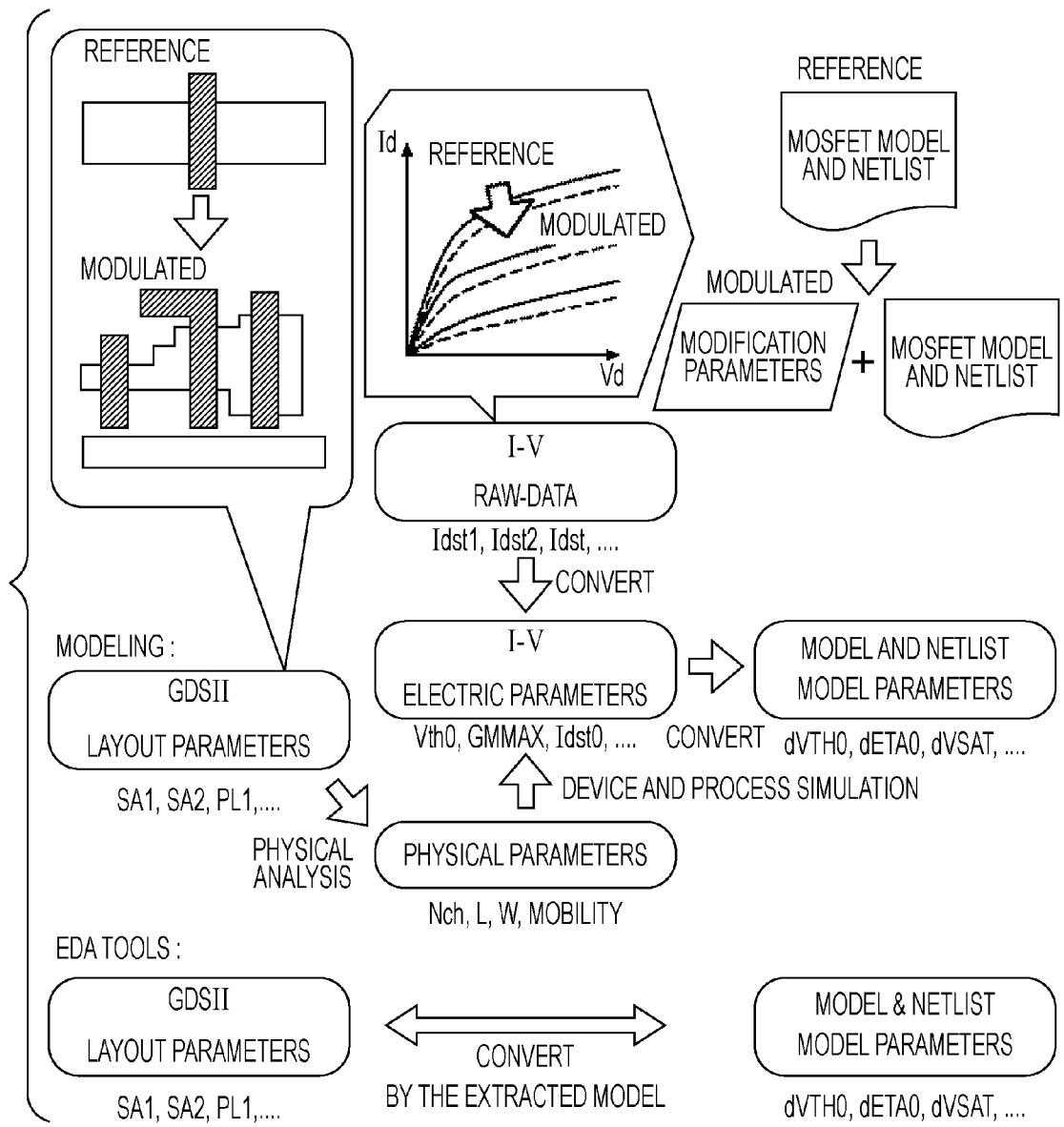
FIG. 6 illustrates a modification of the procedure of correcting data indicating the relationship between the layout data and electrical characteristics of a semiconductor device.

FIG. 6 is a flowchart of a procedure of collecting data indicating the relationship between change in layout data and change in electrical characteristics of a semiconductor device. The relationship between the layout parameters and physical characteristics is obtained first, and then the relationship between the physical characteristics and electrical characteristics is obtained. The relationship between the layout parameters and physical characteristics can be obtained as in expressions 1 to 3. The relationship between the physical characteristics and electrical characteristics can also be obtained as in expressions 1 to 3. The other procedure may be performed by using the multiple regression analysis as in FIG. 5. Alternatively, a relational expression can be calculated on the basis of a computer simulation by using a physical simulator, a stress simulator, an optical simulator, a process simulator, or a device simulator in which physical or electrical characteristics are modeled.

Figure 9:
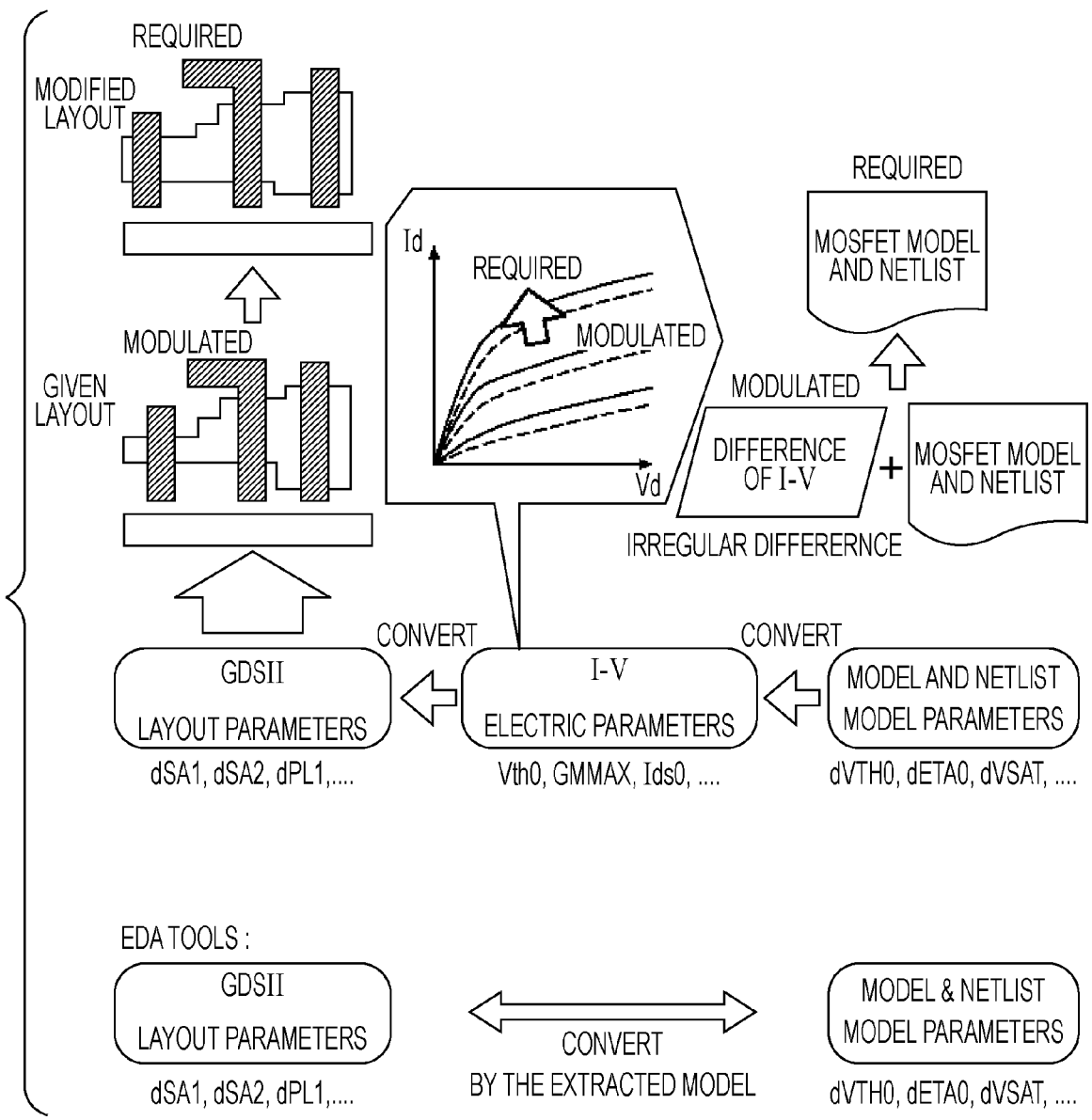
FIG. 9 illustrates an example of a procedure of changing layout data.

FIG. 9 illustrates a schematic flow of a procedure of changing layout data by the information system in order to achieve target values when the layout data and the target values of electrical characteristics to be achieved in the layout data are given.

As described above with reference to FIGS. 5 and 6, the information system has a relational expression expressing how the electrical characteristics of a semiconductor device change when the layout of a standard semiconductor device is changed. The relationship between the layout parameters characterizing the changed layout data and the electrical characteristics is described in a functional relationship. Alternatively, the relationship between the amount of change in layout parameters and the amount of change in electrical characteristics is described in a functional relationship. The degree and property of influence of such a change from the standard layout data differs depending on a manufacturing line or a manufacturing factory of semiconductor devices. This is because respective manufacturing lines and manufacturing factories use different types of manufacturing apparatuses made by different manufacturers and different process parameters to operate the manufacturing apparatuses.

For this reason, even if layout data is created by setting target values of electrical characteristics for a specific manufacturing line and a specific manufacturing factory, the target values of electrical characteristics are not always obtained.

Figure 10A:
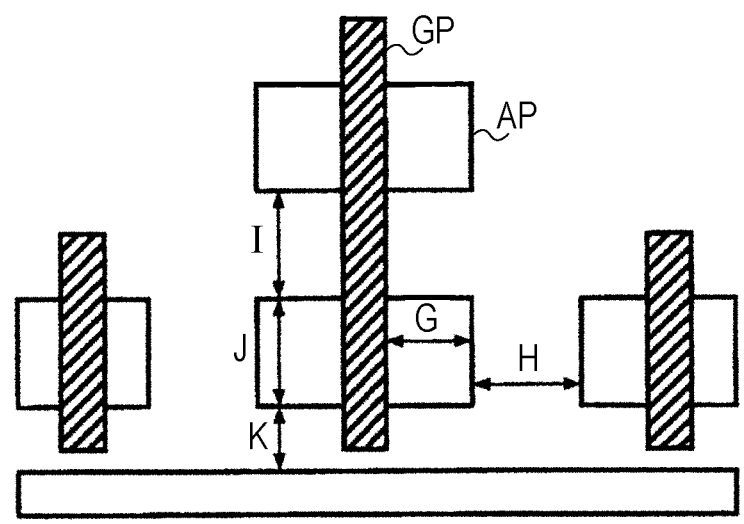
FIG. 10A illustrates an example of a layout of semiconductor elements and a plurality of layout parameters.
Figure 10B:
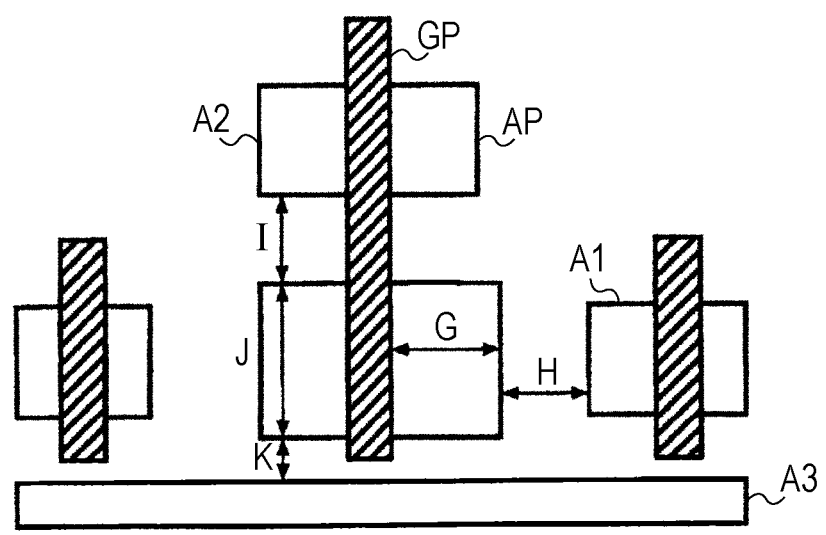
FIG. 10B illustrates an example of a layout of semiconductor elements and a plurality of layout parameters.

Hereinafter, the case where a plurality of layout parameters are not perfectly independently handled is described with reference to FIGS. 10A and 10B. As illustrated in FIGS. 10A and 10B, the pattern dimension represented by symbol G and the pattern gap represented by symbol H are not independent. In this example, the pattern gap H decreases when the pattern dimension G increases. Otherwise, an active layer A1 just on the right of the pattern gap H needs to be moved.

Also, the dimensions of parts indicated by I, J, and K in FIGS. 10A and 10B are not independent. When the dimension J is increased as in FIG. 10B, the pattern gaps I and K need to be decreased at the same time or active layers A2 and A3 adjacent in the vertical direction need to be moved.

When the positions of the adjacent active layers are moved, the scale of integration decreases. It is highly possible that variations in electrical characteristics including the threshold voltage Vth relate to all the dimensions G, H, J, and K. The present invention can be applied to the case where there is one layout parameter. In the above-described pattern, it is preferable to recognize and correct variations in characteristics in view of a plurality of layout parameters.

According to this information system, a relational expression between change in layout parameters SA1, SA2, PL1, . . . in a specific manufacturing line, e.g., in a manufacturing factory different from an originally-expected manufacturing factory, and change in electrical characteristics Vth0, Gmmax, Ids0, . . . is obtained. How to change the pattern to achieve design requirement values can be determined through the inverse transform of a functional relationship from expressions 1 to 3. By calculating the relationship between a plurality of layout parameters having a mutual influence and electrical characteristics as in expressions 1 to 3, the layout can be corrected in view of the influence among the plurality of layout parameters.

Figure 11A:
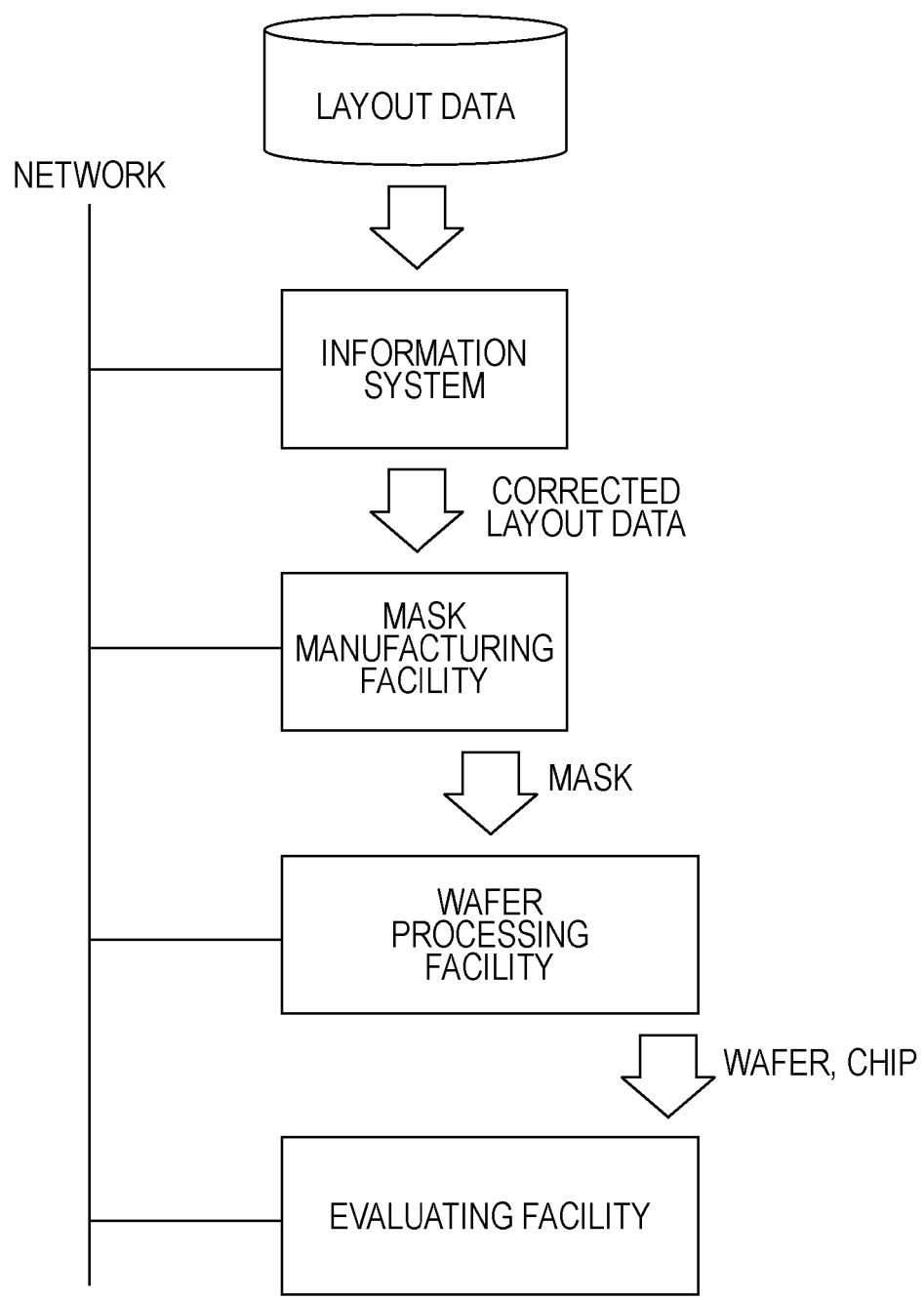
FIG. 11A illustrates an example of a manufacturing system.

FIG. 11A illustrates an example of a configuration of a manufacturing system including the above-described information system. This manufacturing system includes the information system to process layout data, a mask manufacturing facility to manufacture a mask by using corrected layout data, a wafer processing facility to process a wafer by using the manufactured mask, and an evaluating facility to measure electrical characteristics of a semiconductor device from the processed wafer or a chip extracted from the wafer.

As illustrated in FIG. 11A, the information system, the mask manufacturing facility, the wafer processing facility, and the evaluating facility are mutually connected through a network, such as a local area network (LAN). The electrical characteristics eventually measured by the evaluating facility are fed back to the information system. As a result, the relationship between the layout parameters and electrical characteristics is updated and is reflected on a next process of layout data.

Figure 11B:
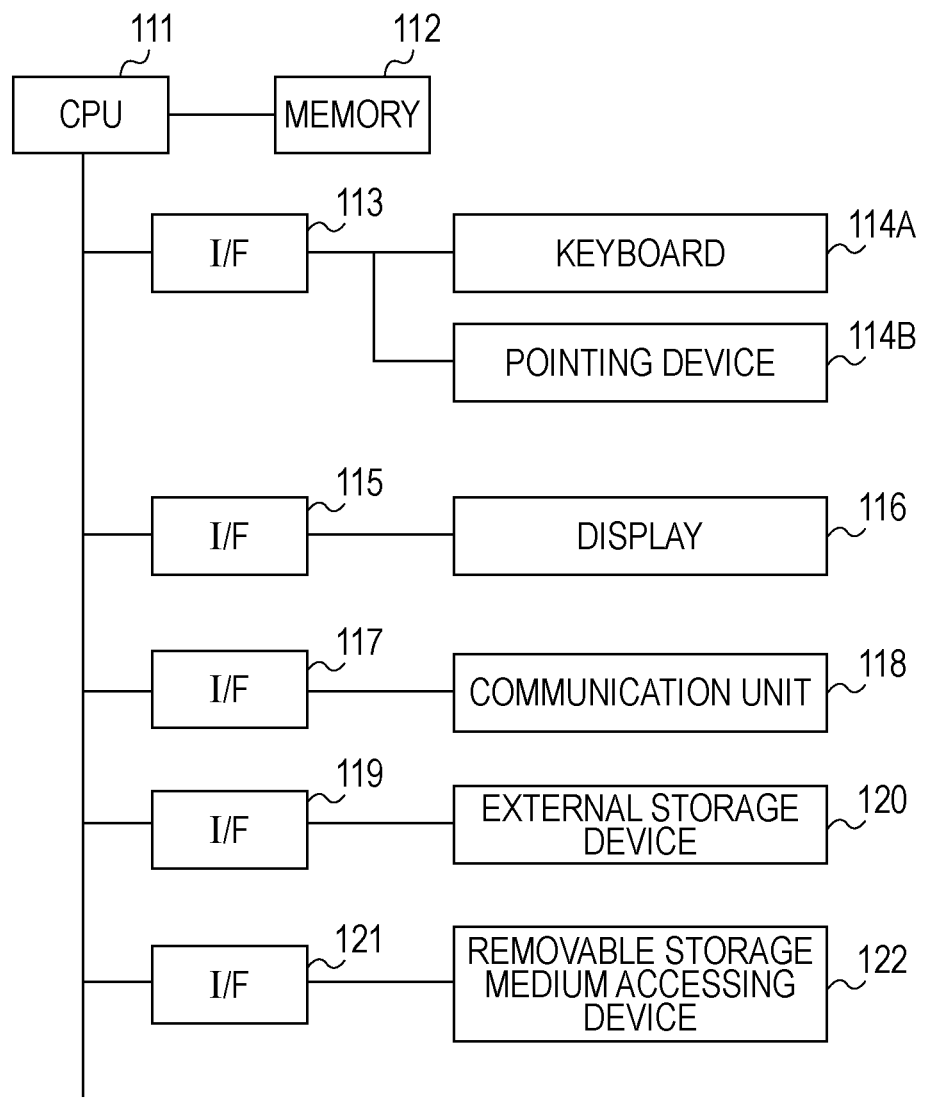
FIG. 11B illustrates an example of a manufacturing system.

FIG. 11B illustrates a hardware configuration of the information system. The information system includes a central processing unit (CPU) 111 to execute a program, a memory 112 to store the program executed by the CPU 111 or data processed by the CPU 111, and a keyboard 114A and a pointing device 114B connected to the CPU 111 via an interface 113. The pointing device 114B is a flat device including a mouse, a trackball, a touch panel, and an electrostatic sensor.

The information system includes a display 116 connected via an interface 115. The display 116 displays information input from the keyboard 114A or data processed by the CPU 111. The display 116 is a liquid crystal display or an electroluminescence (EL) panel.

The information system includes a communication unit 118 connected via an interface 117. The communication unit 118 is a LAN board or the like.

The information system includes an external storage device 120 connected via an interface 119. The external storage device 120 is a hard disk drive, for example. The information system includes a removable storage medium accessing device 122 connected via an interface 121. The removable storage medium is a compact disc (CD), a digital versatile disc (DVD), a flash memory card, or the like.

Figure 12:
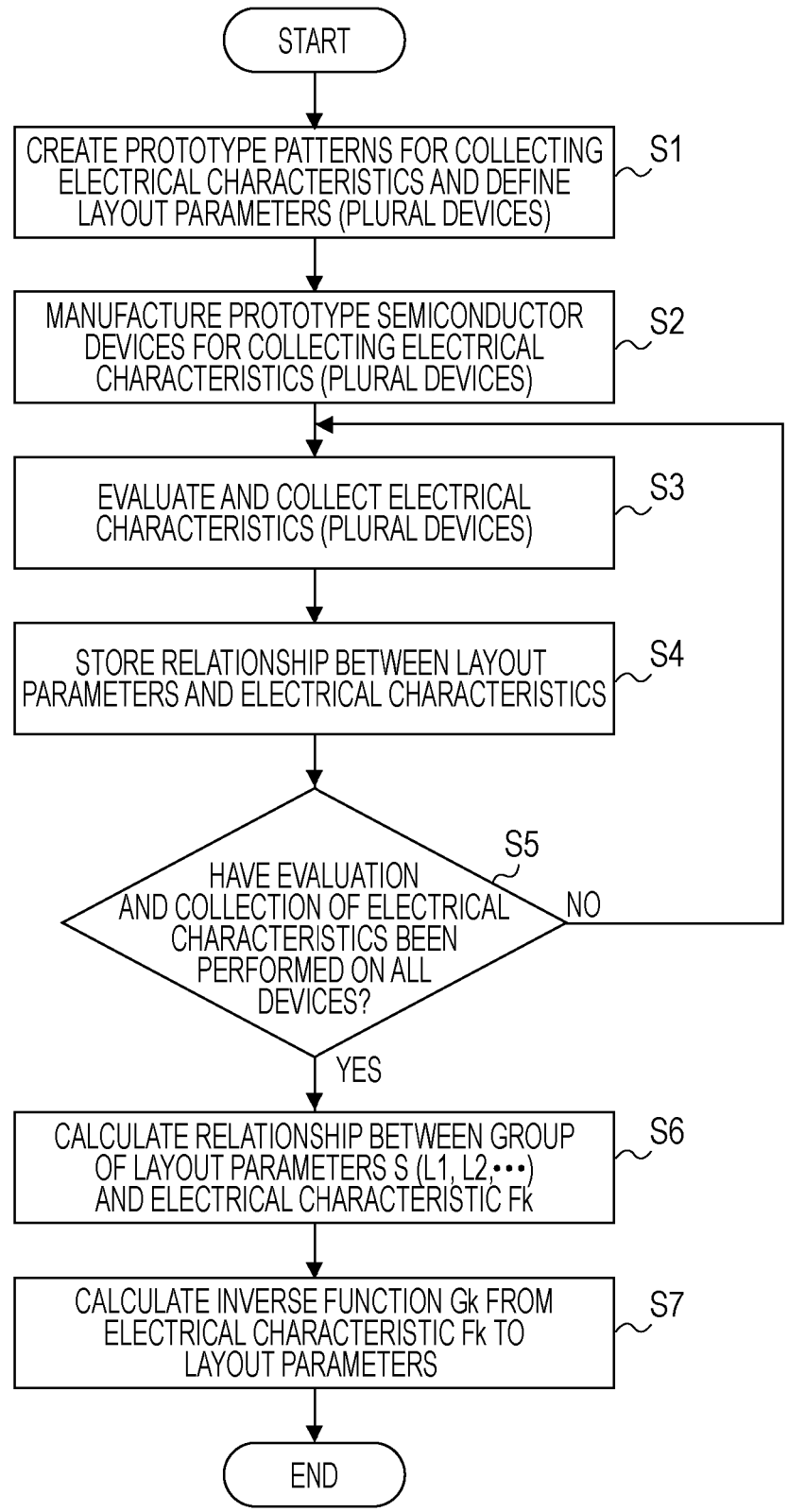
FIG. 12 illustrates an example of a flowchart of a function deciding process.

FIG. 12 is a flowchart of a function deciding process in the manufacturing method according to this embodiment. In this method, a prototype pattern for collecting electrical characteristics is made. Examples of the prototype pattern are illustrated in FIG. 8. The prototype pattern may be made by a design assisting apparatus, such as an LSICAD, instead of the information system. In that case, the prototype pattern may be registered in the information system by using a network or a computer-readable recording medium.

The information system accepts a user operation to set layout parameters via the graphical user interface (S1). In this way, prototype patterns of a plurality of semiconductor devices are registered in the information system, and layout parameters are defined for the respective prototype patterns.

Prototype semiconductor devices are manufactured by inputting layout data to the wafer processing facility in the manufacturing line of semiconductor devices (S2). The mask manufacturing facility manufactures LSI masks. The LSI masks are input to the wafer processing facility, whereby semiconductor devices are manufactured. In this case, the wafer processing facility includes a film forming apparatus, a heat processing apparatus, a resist applying apparatus, a photolithography apparatus, a developing apparatus, a resist removing apparatus, an impurity injecting apparatus, an etching apparatus, and so on.

The evaluating facility measures basic electrical characteristics including current/voltage characteristics of the manufactured semiconductor devices. The measurement is performed by a measuring apparatus, such as a tester, including a terminal group to attach probes to a source, a drain, a gate, and a well of a transistor, a constant-voltage power supply, a voltage sensor, and a current sensor. That is, a predetermined voltage is input to the source, the drain, the gate and the well through the probes, and the current between the source and the drain is measured through the current sensor. On the basis of the basic electrical characteristics, a threshold Vth, an on-current Ids, and so on are calculated.

The data of the basic electrical characteristics is input to the information system (S3). For example, the electrical characteristics may be registered in the information system by using a network or a computer-readable recording medium. With respect to the basic electrical characteristics, information specifying the layout parameters used to manufacture the semiconductor devices, for example, the name of file storing the layout parameters or the layout parameters themselves, is specified. Only the basic electrical characteristics such as the current/voltage characteristics may be measured by the measuring apparatus, and the electrical characteristics such as the threshold Vth and the on-current Ids may be calculated by the information system. The process after this process is controlled by the computer program executed by the CPU 111 of the information system.

The information system stores the relationship between the layout parameters and the basic electrical characteristics in the external storage device (S4). The information system determines whether evaluation and collection of electrical characteristics have been performed on all the manufactured semiconductor devices (S5). If the process has not been performed on all the semiconductor devices, the information system returns the control to step S3.

The information system calculates the relationship between a group of layout parameters, e.g., S (L1, L2, ..., LN), and an electrical characteristic Fk (Fk includes Vth and Ids) in accordance with expressions 1 to 3 (S6). This process can be performed by multivariate analysis, such as regression analysis.

The information system calculates the inverse function Gk from the electrical characteristic Fk to the layout parameters L1, L2, ..., LN (S7).

In this case, if the number of types of electrical characteristic Fk is N or more with respect to the number N of layout parameters, the inverse function Gk may be analytically calculated. Even if the inverse function Gk cannot be calculated analytically, mapping from the electrical characteristics (F1, F2, ..., FN) to the layout parameters (L1, L2, ..., LN) can be obtained as the correspondence between a group of values and a group of values.

If the number of types of electrical characteristic Fk is less than N with respect to the number N of layout parameters, constraints which the layout parameters (L1, L2, ..., LN) should satisfy with respect to the electrical characteristics (F1, F2, ...) are determined. For example, when a relationship Vth=F1 (Lg, Lw) is defined as an electrical characteristic, the constraint between Lg and Lw is determined by setting Vth. As a result, a group of layout parameters is set.

The inverse function Gk from the electrical characteristic Fk to the layout parameters L1, L2, ... can be a multiple value function. Thus, the range where the inverse function Gk to the layout parameters L1, L2, ... is a unique function may be limited in accordance with an operation from the user interface or a design layout rule.

If the inverse function Gk to the layout parameters L1, L2, ... cannot be calculated analytically, it may be calculated by polynomial approximation expressed by expression 2. Instead of calculating the inverse function Gk with respect to the electrical characteristic Fk calculated in step S6, the function Gk may be calculated directly from collected data.

The information system stores a plurality of groups of layout parameters and also stores characteristics F1, F2, ... of semiconductor devices manufactured from layout data including the respective groups. The information system may calculate the function Gk from the characteristics F1, F2, ... of semiconductor devices to the respective layout parameters L1 and so on by regression analysis or the like in the same manner as in expressions 1 to 3.

Figure 13:
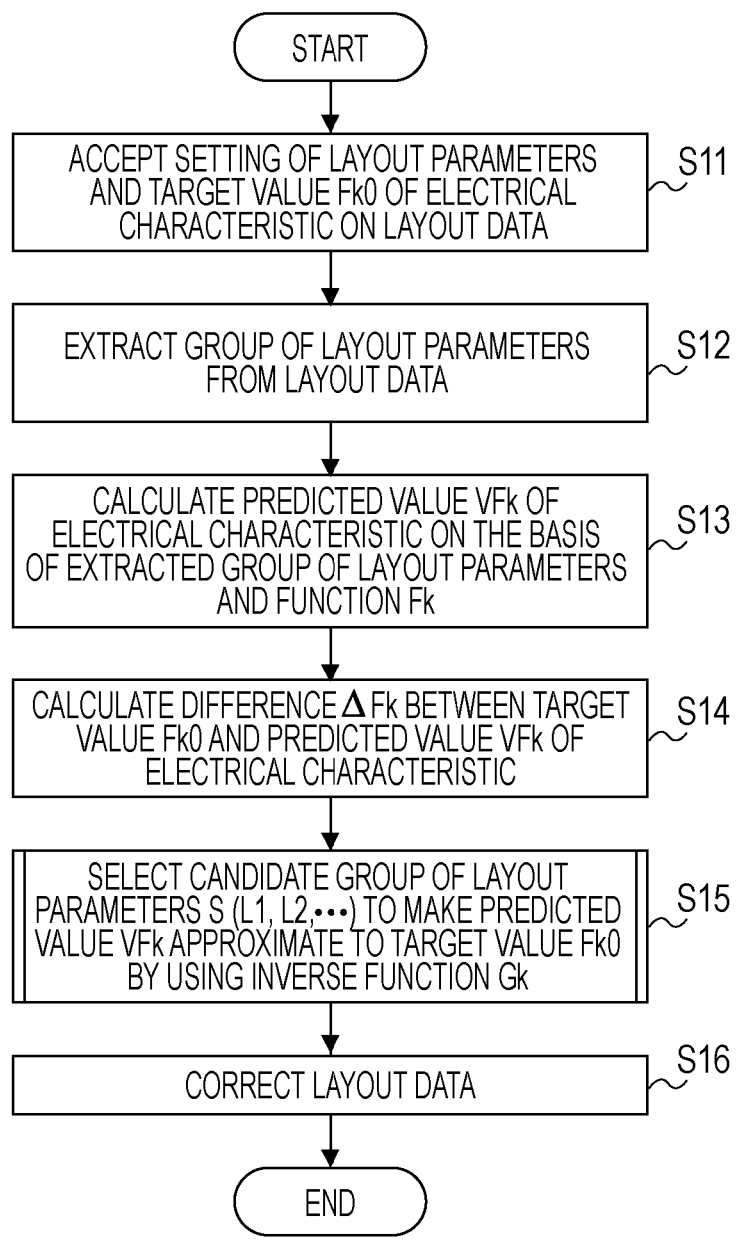
FIG. 13 illustrates an example of a flowchart of a correcting process.

FIG. 13 illustrates an example of a flowchart of a correcting process. This process is controlled by a computer program executed by the CPU 111 of the information system. In this process, the information system accepts specification of the parts corresponding to the layout parameters and a target value Fk0 of the electrical characteristic on the layout data given for manufacturing semiconductor devices (S11). This specification may be accepted through a pointing device, such as a mouse, on the graphical user interface. That is, the corresponding parts on the pattern and the names of parameters may be accepted. The names of parameters are the same as those used in the prototype patterns where the electrical characteristics are collected. The parts on the layout data corresponding to the specified parts of parameters in the prototype patterns, e.g., the definition illustrated in FIG. 7B including a gate width, a gate length, a gate gap, a pattern dimension at a curved portion of the gate, the amount of protrusion of a source/drain portion, etc., may be accepted. Alternatively, a procedure of extracting shape parameters may be loaded in computer software, and parameters may be automatically extracted through calculation by the computer.

In accordance with the specification, the information system extracts a group of layout parameters from the layout data (S12).

The information system calculates a predicted value VFk of the electrical characteristic of the semiconductor device by using the extracted group of layout parameters S (L1, L2, ...) and the function Fk calculated in step S6 (S13).

The information system calculates a differential $\Delta Fk=VFk-Fk0$ between the target value Fk0 and the predicted value VFk of the electrical characteristic (S14). The information system lists candidate groups of layout parameters to make the predicted value VFk approximate to the target value Fk0 by using the inverse function Gk obtained in step S7 (S15). The information system corrects the layout data in accordance with the layout parameters (S16).

Figure 14:
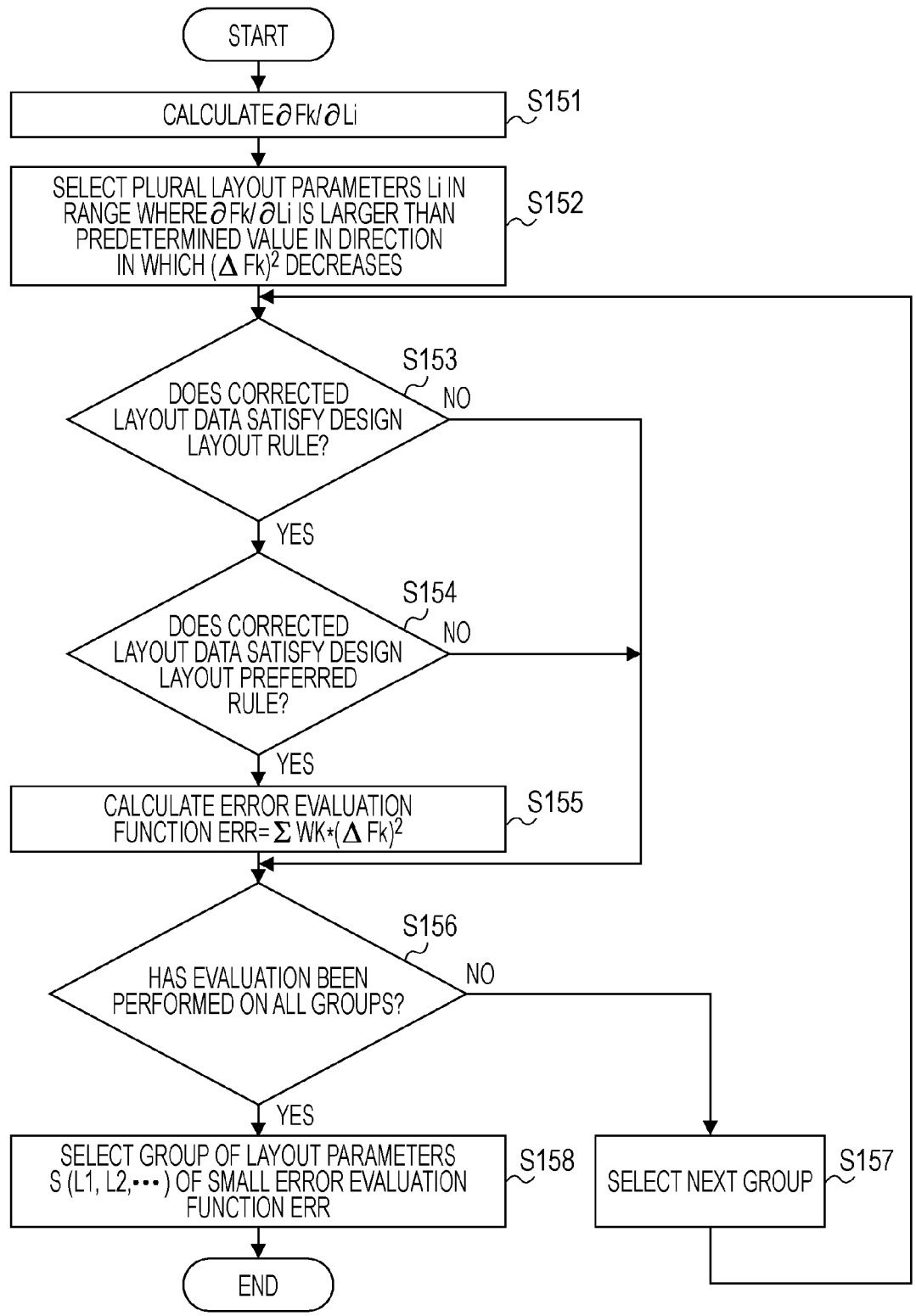
FIG. 14 illustrates an example of a flowchart of a process of listing groups of layout parameters.

FIG. 14 illustrates the details of a process of listing groups of layout parameters. In this process, the information system calculates a partial differential coefficient $\partial Fk/\partial Li$ of the function Fk of electrical characteristics by using layout parameters Li (L1, L2, etc. are collectively called Li) (S151). The information system selects a plurality of layout parameters Li in the range where the partial differential coefficient $\partial FK/\partial Li$ of the function Fk is larger than a predetermined value in the direction in which square of the error $(\Delta Fk)^2$ decreases (S152).

The direction in which the square of the error $(\Delta Fk)^2$ decreases is the range where VFk is smaller than a current value when $\Delta Fk=VFk-Fk0$ is a positive value. This direction is the range where VFk is larger than a current value when $\Delta Fk=VFk-Fk0$ is a negative value. The range where the partial differential coefficient $\partial FK/\partial Li$ is larger than a predetermined value is the range where the amount of change in function value Fk with respect to the amount of change in Li is larger than a predetermined value. As a result of such selection, a plurality of layout parameters Li can be selected in the direction in which $\Delta Fk$ significantly decreases. Alternatively, the range of change in Li may be limited in order to prevent a large absolute value due to inversion of the sign of $\Delta Fk=VFk-Fk0$. For example, assume the case where $\Delta Fk$ is a positive value. In this case, $VFk=Fk$ (L1, L2, ...) is calculated in accordance with Li of the selected groups. If the sign of $\Delta Fk=VFk-Fk0$ changes, Li may be selected from the range $-\Delta Fk<VFk-Fk0<\Delta Fk$. With this procedure, a plurality of groups of layout parameters, such as Sa, Sb, ... Sn (L1, L2, ...), are prepared. The number of groups may be defined as a parameter set in the information system.

Then, the layout data is corrected in accordance with the layout parameters. The information system determines whether the corrected layout data satisfies the design layout rule in accordance with the selected group of layout parameters (S153). Whether the corrected layout data satisfies the design layout rule may be determined by inputting the corrected layout data into a design layout rule examining system DRC and by activating the DRC.

If the corrected layout data does not satisfy the design layout rule, the information system allows the control to proceed to step S156. If the corrected layout data satisfies the design layout rule, the information system determines whether the corrected layout data satisfies the design layout preferred rule (S154). This determination can also be made by using the DRC.

If the corrected layout data does not satisfy the design layout preferred rule, the information system allows the control to proceed to step S156. If the corrected layout data satisfies the design layout preferred rule, the information system calculates an evaluation function of the error. The evaluation function of the error can be calculated by using the following expression 4, for example.

$$ERR=\Sigma Wk*(\Delta Fk)^2 \qquad \text{(Expression 4)}$$

Here, Wk is a weight to the error of each function. The weight may be set to 1 in all cases and the error may be uniformly evaluated. Alternatively, the error of a specific electrical characteristic may be evaluated with a large weight in accordance with a default value of a setting file or an input by a user.

The information system determines whether evaluation of the setting layout rule, the setting layout preferred rule, and the error has been performed on all the groups Sa, Sb, ... Sn of layout parameters (S156).

If evaluation has been performed on not all the groups, the information system selects the next group (S157) and returns the control to step S153. If evaluation has been performed on all the groups, the information system selects a group having the smallest error ERR (S158). Accordingly, the amount of correction is decided and the layout data is corrected.

Figure 15:
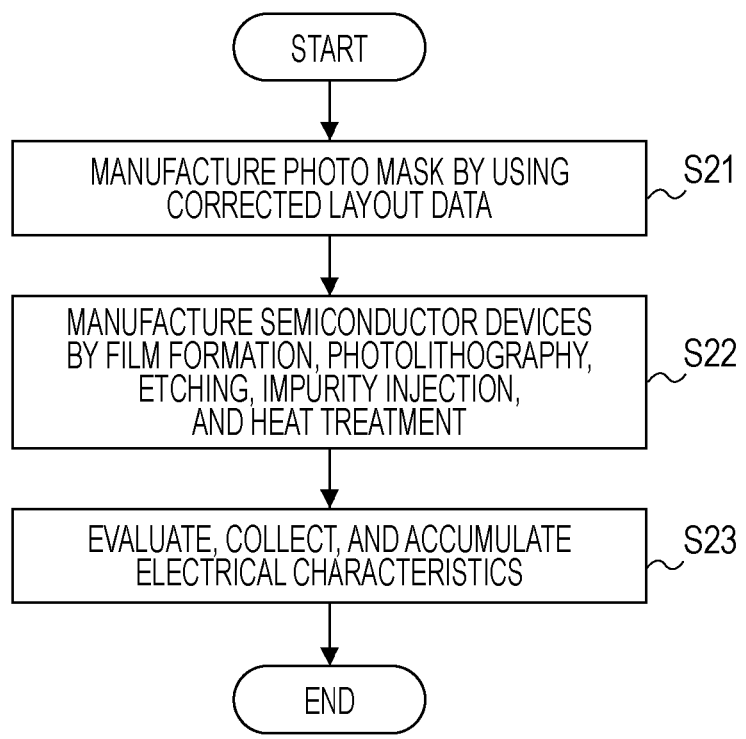
FIG. 15 illustrates an example of a flowchart of a process of manufacturing semiconductor devices using corrected layout data.

FIG. 15 is a flowchart of a process of manufacturing semiconductor devices using the layout data corrected in the above-described process. A photo mask is manufactured by using the corrected layout data (S21). Then, semiconductor devices are manufactured by a process of film formation, photolithography, etching, impurity injection, and heat treatment (S22).

During the manufacturing process, electrical characteristics of the semiconductor devices are evaluated, collected, and accumulated. The accumulated data is used in the next correction.

Figure 16A:
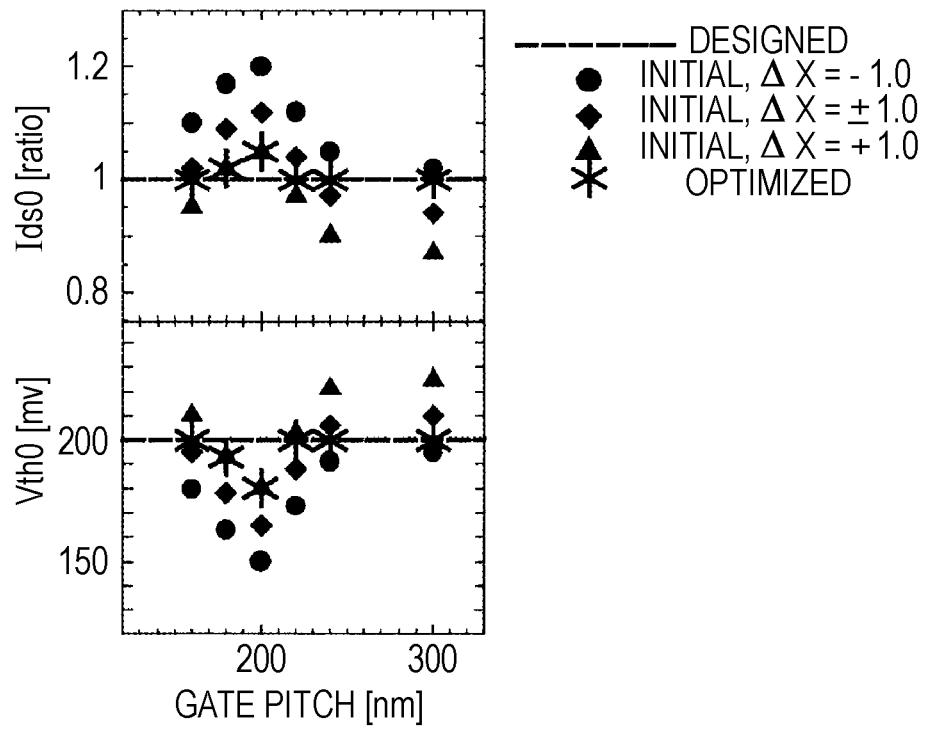
FIG. 16A illustrates an example of a result obtained by measuring an on-current and a threshold voltage of a plurality of layouts.
Figure 16B:
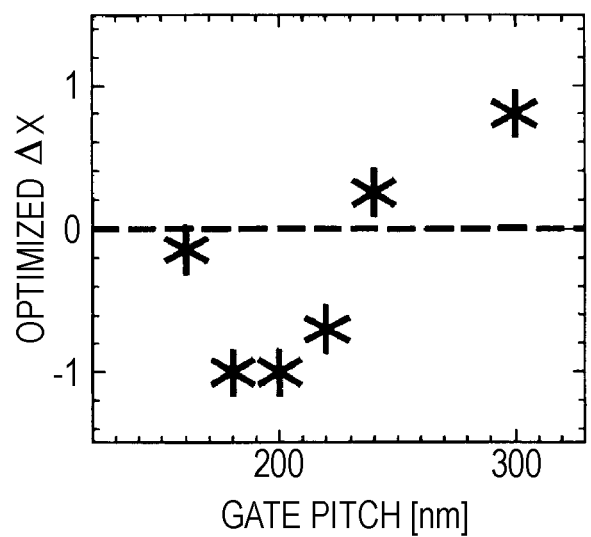
FIG. 16B illustrates an example of the amount of change in parameter X.
Figure 17:
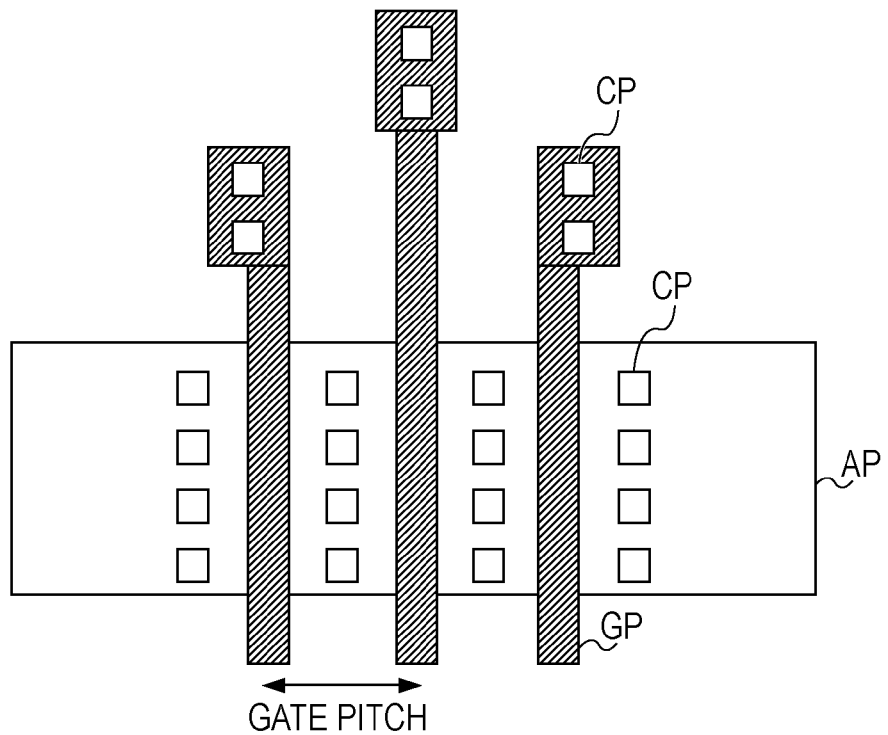
FIG. 17 illustrates an example of layout data of transistors used for measuring electrical characteristics in FIG. 16A.

FIGS. 16A and 16B illustrate example 1 of correction of electrical characteristics. FIG. 17 illustrates an example of layout data of transistors used at the measurement of the electrical characteristics. FIG. 16A shows a result of a measurement of on-currents (ids0) and threshold voltages (Vth0) in a plurality of layouts of a multistage series MOSFET. FIG. 17 illustrates a layout pattern of the semiconductor device in which the electrical characteristics shown in FIG. 16A are measured. G-pitch represents a gate pitch.

In a layout of the multistage series MOSFET, the gate pitch is not considered in a simulation of an ordinary SPICE model. The electrical characteristics should preferably be constant regardless of the gate pitch.

When semiconductor devices are actually manufactured, the variation illustrated in FIG. 16A occurs, for example. When such a variation occurs, since the relational expression expressing the relationship between the layout parameters and electrical characteristics has been obtained, the layout parameters including a gate pitch and a correction parameter X of optical proximity correction (OPC) are changed.

In that case, the amount of variation of the electrical characteristics (Vth0, Ids0, ...) has already been determined from the relational expression. Thus, a correction amount of the parameter X to achieve the target value can be obtained through inverse calculation of the relational expression. Here, an example of correcting $\Delta X$ in a range of $\pm 1.0$ is shown (*). FIG. 16B illustrates the amount of change in parameter X in the respective gate pitches. In FIG. 16A, * indicates electrical characteristics (Ids0 and Vth0) of the semiconductor device obtained when the layout is corrected by X that is corrected by the value of $\Delta X$ in FIG. 16B. Here, Ids0 and Vth0 represent a threshold current and a drain current measured under a predetermined bias condition.

In FIG. 16A, black circles, black squares, and black triangles are measurement data in the semiconductor device corresponding to an uncorrected layout. Those marks correspond to $\Delta X=-1$, 0, and 1, respectively.

The horizontal and vertical axes and the optimized parameters in example 1 are only an example. A plurality of layout parameters may be used as variables and a plurality of electrical characteristic parameters may be used in the vertical axis.

In example 1, one of the OPC correction parameters is regarded as X, and the correction amount of X is calculated as a gate pitch function to the gate pitch, which is one of the layout parameters. Application of this method is not limited to this example.

Instead of the OPC correction parameters, the layout parameters themselves may be corrected. That is, a gate length, a gate width, a gate pitch, a distance between a crank shape or T-shape of gate or active and a MOSFET, an STI width, and a shape of active dummy reflected on a reticle may be corrected.

The horizontal axis in FIGS. 16A and 16B in example 1 indicates a gate pitch, which is one of the layout parameters. Alternatively, the horizontal axis may indicate a gate length, a gate width, a gate pitch, a distance between a crank shape or T-shape of gate or active and a MOSFET, an STI width, and a shape of active dummy reflected on a reticle.

The target electrical characteristics are not limited to Vth0 and Ids0. Alternatively, three, ten, or twenty electrical characteristic parameters may be regarded as a target, and a difference between a target characteristic and a real characteristic to be corrected may be evaluated by setting a certain evaluation function. The number of corrected parameters is not limited to one.

Figure 18:
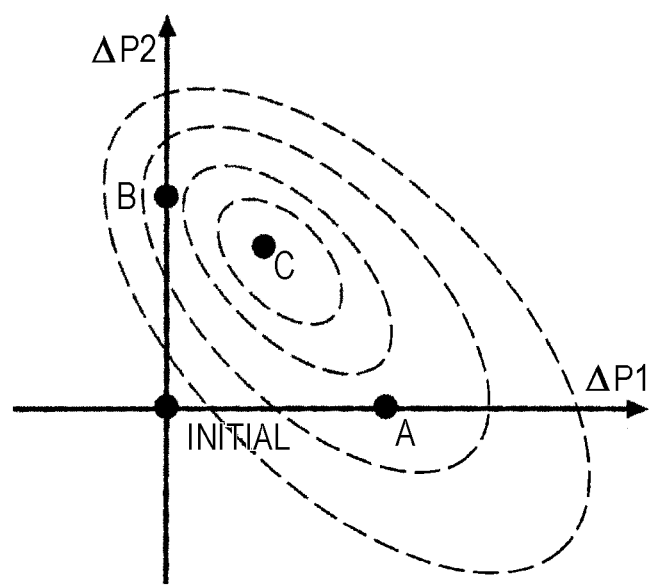
FIG. 18 is a conceptual view illustrating an example of an influence of layout parameters.

Hereinafter, a concept of correcting electrical characteristics of a semiconductor device by using a plurality of layout parameters is described with reference to FIGS. 18 to 20. FIG. 18 is a conceptual view illustrating an influence of layout parameters P1 and P2.

Correction amounts from an initial state are defined as ($\Delta P1$, $\Delta P2$), respectively, and these values are regarded as values in an X-axis direction and a Y-axis direction. An evaluation function indicating whether the value is approximate to a target value at the time is considered.

For example, assume that the value is approximate to the target value as F (ΔP1, ΔP2) is small. At this time, F (ΔP1, ΔP2) can be shown in a contour map. Contour data can be described as a group of values in a computer, such as (ΔP1$i$, ΔP2$i$, Hi), in which i=1, 2 . . . .

On the basis of layout-dependent actual measurement data, the contour lines of F (ΔP1, ΔP2) are broken lines in FIG. 18. Point C is an optimized point, that is, a smallest point. In the correction with one parameter, the optimized value is obtained at point A when only P1 is used, or the optimized value is obtained at point B when only P2 is used. Compared to the value at point C, the values at points A and B are not optimized. In the information system realizing this method, the optimized value is obtained on the basis of correlation among a plurality of layout parameters, and thus optimization can be performed more appropriately than in correction using one parameter. FIG. 18 is three-dimensional space with two parameters. In general, multi-dimensional space of two or more dimensional space is realized, and a plane of equal altitude is obtained instead of the contour lines.

FIG. 18 is based on the assumption that F (ΔP1, ΔP2) is continuous, and F (ΔP1, ΔP2) may be discontinuous. When F (ΔP1, ΔP2) is continuous, an optimum value can be obtained by a known optimizing problem solution, such as Marquardt method or Simplex method. F may be a weighted square sum of the difference between Ids or Vth and a target value.

Figure 19:
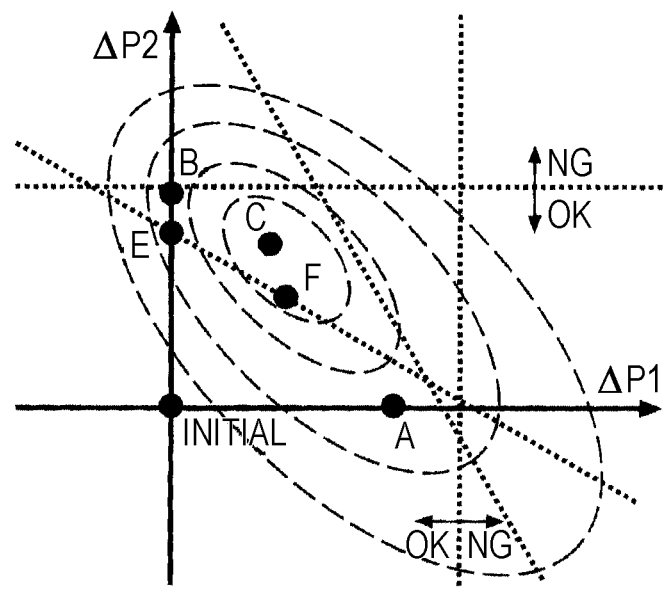
FIG. 19 illustrates an example of optimization in the case where constraints are added.

With reference to FIG. 19, optimization in the case where constraints are added is considered. Assume that there are four constraints and that the optimum value is on the origin side relative to the four dotted lines in FIG. 19. Under the constraints, the optimized point, that is, the minimum point is point F. In the correction using one parameter, the optimum value is at point A in the case of using only P1, and the optimum value is at point E in the case of using only P2.

The values at both points A and E are not optimized compared to the value at point F. In the present invention, the optimum value is obtained by appropriately considering constraints on the basis of the correlation among a plurality of layout parameters, and thus optimization can be achieved more appropriately than in the correction using one parameter. In FIG. 19, a half-plane partitioned by borders of straight lines is used as the constraints however, the constraints may be diversified in general. When F is continuous, the optimum value can be obtained by a known optimizing problem solution, such as Marquardt method or Simplex method.

Figure 20:
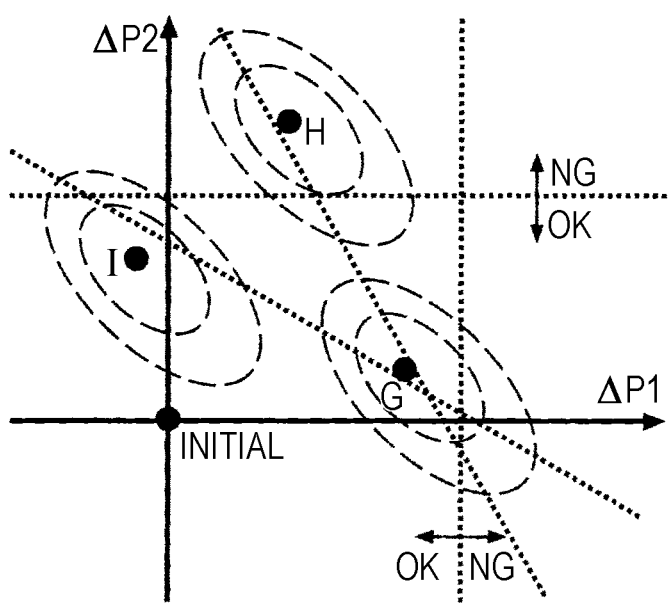
FIG. 20 illustrates an example of a concept of correction in the case where there are a plurality of solutions satisfying an optimum value.

FIG. 20 illustrates an example of a concept of correction in the case where there are a plurality of solutions to satisfy the optimum value. In FIG. 20, the set of P1 and P2 to satisfy the optimum value exists at three points G, H, and I. Optimization in the case where constraints are added is considered. Assume that there are four constraints and that the optimum value is positioned on the origin side, relative to the four dotted lines in FIG. 20.

Under the constraints, the optimized point, or minimum point, is point I. When there are many points satisfying the optimum solution, points G, H, and I satisfying the optimum value may be obtained, and then point I may be selected in view of the constraints. The optimizing problem may be directly solved within the constraints. If there are many solutions in that case, any point may be selected.

Figure 21:
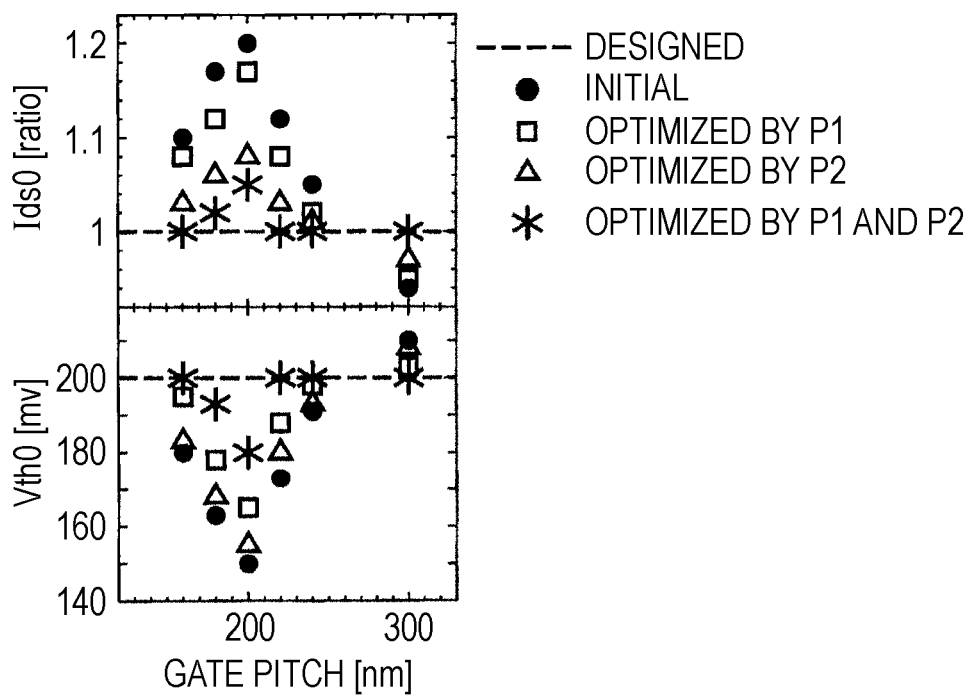
FIG. 21 illustrates an example of measured electrical characteristics.

FIG. 21 illustrates an example of measured electrical characteristics in the case where this method is applied to a semiconductor device. In FIG. 21, black circles indicate an example of characteristics before correction. Rectangular marks indicate an example of the case where correction is performed with only parameter P1. Triangle marks indicate an example of the case where correction is performed with only parameter P2. * indicates an example of the case where correction is performed with parameters P1 and P2. By generally correcting layout data by using a plurality of layout parameters, the electrical characteristics can be controlled to target values more accurately than in a conventional method. When a plurality of electrical characteristics should be optimized, for example, when both on-current Ids and threshold Vth should be set to designed values, this method is advantageous.

What is claimed is:

1. A method of manufacturing a semiconductor device comprising:
    measuring an electrical characteristic of a plurality of semiconductor elements;
    defining layout parameters on the basis of layout data of the plurality of semiconductor elements and deciding a functional relationship between the layout parameters and the electrical characteristic;
    extracting values of the layout parameters from design layout data of the semiconductor device;
    calculating a predicted electrical characteristic of the semiconductor device on the basis of the values of the layout parameters and the functional relationship;
    calculating a difference between a target electrical characteristic and the predicted electrical characteristic of the semiconductor device;
    obtaining a second mapping relationship from the electrical characteristic to the layout parameters, which is an inverse function of a first mapping relationship from the layout parameters to the electrical characteristic, based on the first mapping relationship;
    generating, by using the second mapping relationship, a plurality of candidates of the values of the layout parameters which make the predicted electrical characteristic approximate to the target electrical characteristic;
    selecting a specific value from among the candidates so as to decrease the difference between the target electrical characteristic and the predicted electrical characteristic;
    changing the design layout data based on the specific value;
    manufacturing the semiconductor device on the basis of the changed design layout data;
    calculating a partial differential coefficient by differentiating the functional relationship with respect to the layout parameters; and
    selecting the specific value in a range where the partial differential coefficient is equal to or larger than a predetermined reference value in a direction in which square of the difference decreases.

2. The method according to claim 1, wherein a value which satisfies a design layout rule, is selected in selecting the specific value.

3. The method according to claim 1, wherein different weights are given to the difference between the target electrical characteristic and the predicted electrical characteristic about a plurality of types of the electrical characteristic of the plurality of semiconductor elements in selecting the specific value.

4. The method according to claim 1, the electrical characteristic includes any one of a threshold voltage of a transistor, an on-current, an off-leak current, delay time of a logic circuit, and a life of the element.

5. The method according to claim 1, wherein the layout parameters include at least one of a gate length, a gate width, a pitch to an adjacent gate, a gate length of the adjacent gate, a width of an active region, a distance to an adjacent active region, and a width of the adjacent active region.

6. The method according to claim 1, further comprising:
determining whether the design layout data after a correction satisfies a mask design rule.

7. The method according to claim 1, further comprising:
determining whether the design layout data after a correction satisfies a rule recommended in manufacturing.

8. The method according to claim 1, wherein the layout parameters include two or more of a gate length, a gate width, a pitch to an adjacent gate, a gate length of the adjacent gate, a width of an active region, a distance to an adjacent active region, and a width of the adjacent active region.

* * * * *